(12) United States Patent
Hung

(10) Patent No.: US 7,189,926 B2
(45) Date of Patent: Mar. 13, 2007

(54) LOW VOLTAGE DIFFERENTIAL SIGNAL (LVDS) INTERFACE FLEXIBLE FLAT CABLE (FFC) AND LVDS SIGNAL TRANSMISSION SYSTEM USING THE SAME

(75) Inventor: Sheng-Li Hung, Taoyuan (TW)

(73) Assignee: P-Two Industries Inc., Taoyuan County (TW)

( * ) Notice: Subject to any disclaimer, the term of this patent is extended or adjusted under 35 U.S.C. 154(b) by 259 days.

(21) Appl. No.: 10/910,588

(22) Filed: Aug. 4, 2004

(65) Prior Publication Data
US 2006/0030171 A1     Feb. 9, 2006

(51) Int. Cl.
*H01B 7/08*       (2006.01)
(52) U.S. Cl. ..................... 174/117 F; 439/329
(58) Field of Classification Search ............ 174/117 F, 174/117 FF; 439/329, 465
See application file for complete search history.

(56) References Cited

U.S. PATENT DOCUMENTS

| | | | |
|---|---|---|---|
| 4,543,294 A * | 9/1985 | Sakagami et al. | 428/422 |
| 4,778,403 A * | 10/1988 | Ikesugi et al. | 439/329 |
| 5,133,674 A * | 7/1992 | Albrecht | 439/465 |
| 6,518,503 B1 * | 2/2003 | Yamanobe et al. | 174/117 FF |

* cited by examiner

*Primary Examiner*—Chau N. Nguyen
(74) *Attorney, Agent, or Firm*—Bacon & Thomas, PLLC

(57) ABSTRACT

This invention discloses a flexible flat cable (FFC) which has a characteristic impedance ($Z_0$) of 100Ω±5% and is used in a low voltage differential signaling (LVDS) signal transmission system for reducing the quantity of components of the LVDS signal transmission system and its costs, and the LVDS signal transmission system is a high-frequency signal transmission system between a liquid crystal display (LCD) interface and a system board interface, which comprises a low voltage differential signal (LVDS) receiver, a flexible flat cable (FFC) having an characteristic impedance ($Z_0$) of 100Ω±5%, an accessory insert board, and a lift-up connector; wherein the LVDS receiver constitutes the signal transmission interface for the LCD and the lift-up connector constitutes the signal transmission interface for the system board interface, and one end of the flexible flat cable having the characteristic impedance ($Z_0$) of 100Ω±5% together with the accessory insert board constitute a structure similar to an LVDS connector and electrically connects the LVDS connector, and the other end of the flexible flat cable with the characteristic impedance ($Z_0$) of 100Ω±5% electrically connects the lift-up connector.

9 Claims, 4 Drawing Sheets

LOW VOLTAGE DIFFERENTIAL SIGNAL (LVDS) INTERFACE FLEXIBLE FLAT CABLE (FFC) AND LVDS SIGNAL TRANSMISSION SYSTEM USING THE SAME

BACKGROUND OF THE PRESENT INVENTION

1. Field of the Present Invention

The present invention relates to a flexible flat cable (FFC) applicable to low voltage differential signaling interfaces, more particularly a flat flexible cable (FFC) having a characteristic impedance ($Z_0$) of 100Ω±5% to be used in a low voltage differential signaling (LVDS) signal transmission system.

2. Description of Prior Act

Referring to FIGS. 1 and 2, since a large volume and a high frequency of signal transmissions occur between the liquid crystal display (LCD) and the main system, therefore the present high-frequency signal transmission system constructed between a liquid crystal display interface 10 and a system board interface 20 adopts the low voltage differential signaling (LVDS) receiver featuring a high speed at 1.4 Gb/s, a low power consumption and a low electromagnetic radiation as the signal transmission interface for the liquid crystal display interface 10. With the connection of a transmission line 15 and the system board interface 20 (that is the socket 22 of the connector on the system board interface 20, signal connection is constituted and a prior LVDS signal transmission system 11 is defined.

However, according to the standard of the LVDS interface defined by the ANSI/TIA/EIA-644-1995, the transmission line 15 used for such LVDS signal transmission system 11 must have a characteristic impedance ($Z_0$) of 100Ω±5% to match up with the impedance (Z) of the circuits of liquid crystal display interface 10 and the system board interface 20.

In the meantime, this kind of LVDS signal transmission system 11 must meet this requirement to lower the electromagnetic interference and eliminate noise interference in order to correctly carry out the signal transmission between the liquid crystal display interface (hereinafter referred as LCD interface) 10 and the system board interface 20 or avoid producing errors, otherwise a signal reflection and a noise interference will be produced in the signal transmission between the LCD interface 10 and the system board interface 20 and cause loss, deformation or distortion of signals.

The transmission line 15 suitable for being used in the prior LVDS signal transmission system 11 includes the traditional wire cable having a characteristic impedance ($Z_0$) of 100Ω±5%, a flexible printed circuit, or a mini coaxial cable, etc.

However, the prior flexible flat cable has a simple structure and a lower cost, but its characteristic impedance is approximately 130 Ω which is not in compliance with the standard and specification of the LVDS signal transmission system 11. Therefore, this kind of flexible flat cable is not applicable for the prior LVDS signal transmission system 11.

Further, the transmission line 15 used for the prior signal transmission system 11 as shown in FIGS. 1 and 2 must have a LVDS connector 14 at one end of the transmission line 15 for connecting the LVDS receiver 12 of the LCD interface 10, and the other end of the same transmission line 15 must have a plug (or a socket) 24 for connecting a socket (or a plug) of the system board interface. After the LVDS connector 14 at one end of the transmission line 15 and the LVDS receiver 12 of the LCD interface 10 are connected, the connector 24 at the other end is electrically connected with the connector 22 of the system board interface 20 to define a prior LVDS signal transmission system 11 between the LCD interface 10 and the system board interface 20.

In other words, the prior LVDS signal transmission system 11 currently used for transmitting signals between the LCD interface 10 and the system board interface 20 is a LVDS signal transmission system comprising five components including a LVDS receiver 12, a LVDS connector 14, a transmission line 15 having a characteristic impedance of 100Ω, a plug of the connector 24 and a socket 22 of the connector. As to the cost, the inventor of the present invention believes that such prior LVDS signal transmission system 11 has more components and requires a more expensive transmission line 15, and thus the prior needs further improvements.

In the solutions for reducing the quantity of components and lowering the cost, some manufacturers improve the aforementioned transmission line by improving the flexible printed circuit (FPC) by means of building the plug or socket directly on both ends of the flexible printed circuit, and thus it no longer needs to build additional plugs or sockets for the connector of the flexible printed circuit (FPC), but electrically connect the connector. Such arrangement can achieve the objectives of reducing the quantity of components and lowering the cost.

A prior flexible connector 33 disclosed in U.S. Pat. No. 6,743,045 is as shown in FIG. 3. The flexible connector 33 has an insulator 35 which is coupled individually on a position proximate to both ends, both ends of the flexible connector 33 constitute a structure similar to the plug of a connector, and thus it is not necessary to build additional plugs or sockets for connecting the flexible connector 33 to be used together with a socket 36 of the connector of a first printed circuit board 31 and a socket 37 of the connector of a second printed circuit board 31 and define a signal transmission system.

Although such signal transmission system can achieve the objective of lowering costs, it is still a signal transmission system that requires five components comprising a flexible connector 33, a socket 36 for the connector of a first printed circuit board 31, a socket 37 for the connector of a second printed circuit board 31, and two couplers for coupling an insulator 35 disposed on both sides of the flexible connector 33. Therefore, such signal transmission system still needs further improvements for reducing the quantity of components.

Particularly in the area of the prior flexible connector, a prior flexible flat cable has not been taught explicitly or implicitly to be used in the prior LVDS signal transmission system 11.

Thus, if the characteristic impedance ($Z_0$) of a prior flexible flat cable having a simple structure and a low cost can be adjusted and accurately limited to about 100Ω, then such flexible flat cable mot only can satisfy the requirements of the standard and specifications of the LVDS signal transmission system 11 and greatly save the manufacturing cost of the LVDS transmission line, but also can offer a new application to the prior flexible flat cable by using the prior flexible as the LVDS transmission wire which breaks through the biased view of the flexible flat cable not applicable to be used as the LVDS transmission line. In the meantime, the LVDS signal transmission system adopting this kind of flexible flat cable can be developed, so that the objectives can be achieved for reducing the quantity of components and lowering the cost of the LVDS signal transmission system.

SUMMARY OF THE PRESENT INVENTION

It is therefore a primary objective of the present invention to provide a flexible flat cable having characteristic impedance ($Z_0$) of 100Ω±5% that can be used as the LVDS transmission line, such that the flexible flat cable can have the soft, refractory and temperature resisting features in addition to the new application.

Another objective of the present invention is to provide a flexible flat cable applicable for the LVDS interface and disclose an LVDS signal transmission signal adopting this kind of flexible flat cable in order to reduce the quantity of components and lower the cost of the LVDS signal transmission system.

A further objective of the present invention is to provide an LVDS signal transmission signal system comprising four components such as an LVDS receiver, a flexible flat cable having characteristic impedance ($Z_0$) of 100Ω±5%, an accessory insert board and a lift-up connector in order to achieve the objectives of reducing the quantity of components and lowering the cost of the LVDS signal transmission system.

Another further objective of the present invention is to provide an LVDS signal transmission system comprising of five components such as an LVDS receiver, a flexible flat cable having characteristic impedance ($Z_0$) of 100Ω±5%, an accessory insert board, an EMI resisting metal coupler and a lift-up connector in order to add an EMI resisting effect to the LVDS signal transmission system.

BRIEF DESCRIPTION OF THE DRAWING FIGURES

FIG. 1 is an illustrative view of a prior LVDS signal transmission system 11 built between a LCD interface 10 and a system board interface 20.

FIG. 2 is an exploded view of the prior LVDS signal transmission system 11 as depicted in FIG. 1 having five components such as a LVDS receiver 12, a LVDS connector 14, a transmission line having a characteristic impedance of 100Ω 15, a plug of a connector 24 and a socket of a connector 22.

FIG. 3 is an illustrative view of the "Flexible transmission link having integral connectors" as disclosed in U.S. Pat. No. 6,743,045 showing that although both ends of the flexible connector 33 do not require a plug or a socket for the connector, yet it is necessary to use the disclosed insulator 35 to match with the socket of the connector 36 of a first printed circuit board 31 and a socket of the connector 37 of a second printed circuit board 31, and such signal transmission system comprises five components.

FIG. 4 is an illustrative view of the flexible flat cable 40 having a characteristic impedance of 100Ω serving as a LVDS transmission line according to the present invention and working together with an LVDS receiver 12, an accessory insert board 60 and a lift-up connector 50 to define a 4-component LVDS signal transmission system 11.

Figure 7:
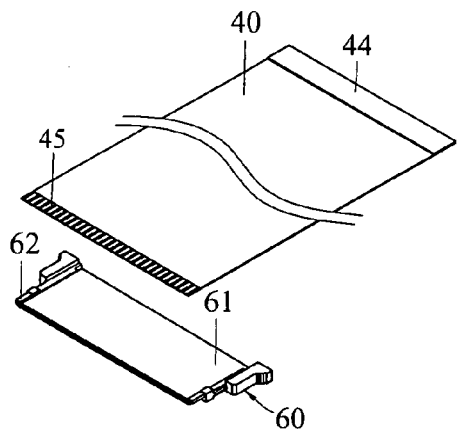

FIG. 7 is an illustrative view of the structure of the accessory insert board 60 having an indented space 61 for accommodating the flexible flat cable 40 that includes a small area of the second electric conductive section 45 according to the present invention.

Figure 8:
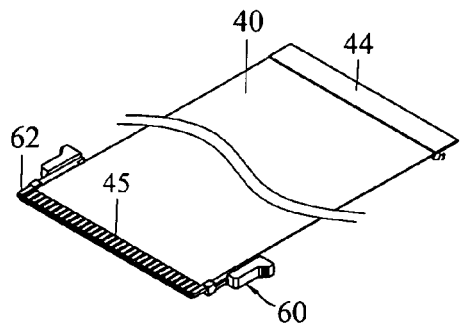

FIG. 8 is an illustrative view of the front section 62 of the accessory insert board 60 being adhered to the bottom of the second electric conductive section 45 of the flexible flat cable 40 and joining the second electric conductive section 45 of the flexible flat cable 40 to constitute a connector similar to the LVDS connector according to the present invention.

Figure 9:
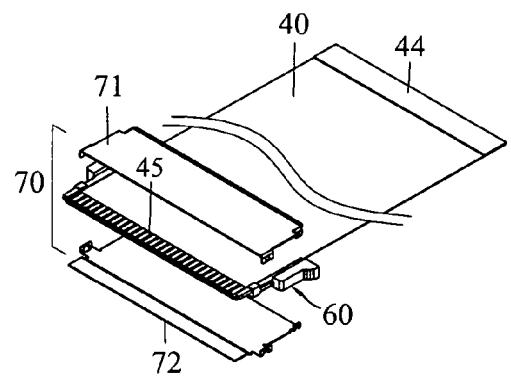

FIG. 9 is an exploded view of the EMI resisting metal coupler 70 having an upper plate 71 and a lower plate 72 coupled with each other and fixed onto the accessory insert board 60 of the flexible flat cable 40 according to the present invention.

Figure 10:
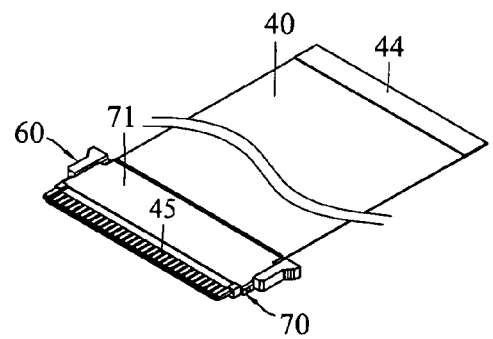

FIG. 10 is an illustrative view of the EMI resisting metal coupler 70 being fixed onto the accessory insert board 60 containing a flexible flat cable 40 such that the end where the flexible flat cable 40 and the LVDS receivers 12 are connected has the EMI resisting function according to the present invention.

Figure 11:
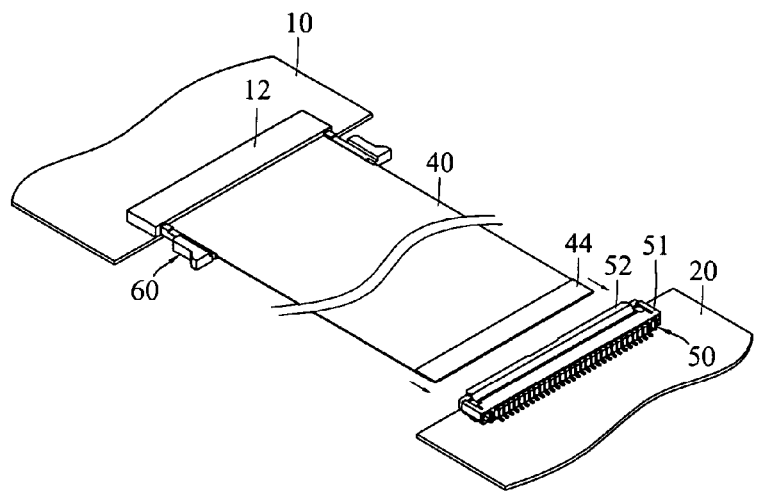

FIG. 11 is an illustrative view of the LVDS signal transmission system 11 according to the present invention, wherein when the second electric conductive section 45 of the flexible flat cable 40 and the front section 62 of the accessory insert board 60 are inserted into the LVDS receiver 12, the second electric conductive section 45 of the flexible flat cable 40 is electrically connected with the LVDS receiver 12.

Figure 12:
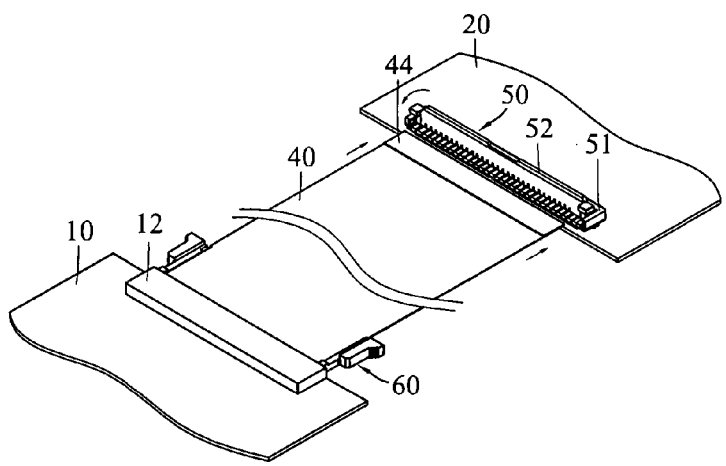

FIG. 12 is an illustrative view of the LVDS system 11 according to the present invention, wherein the movable lift-up lid 52 of the lift-up connector 50 is lifted up to receive the insertion of the first electric conductive section 44 of the flexible flat cable 40 for an electric connection.

Figure 1:
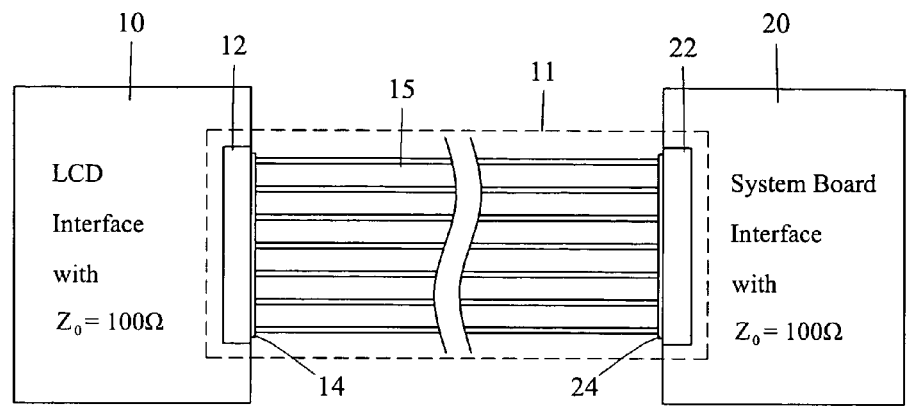
Figure 2:
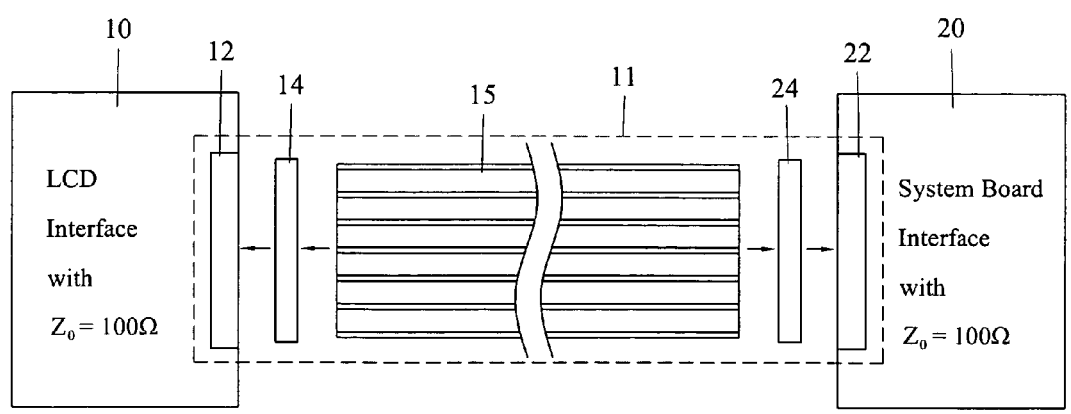
Figure 3:
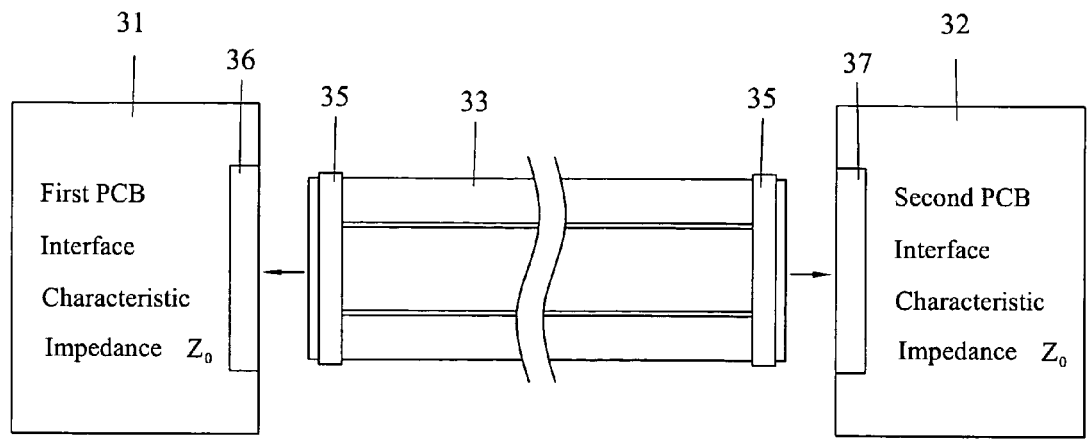
Figure 13:
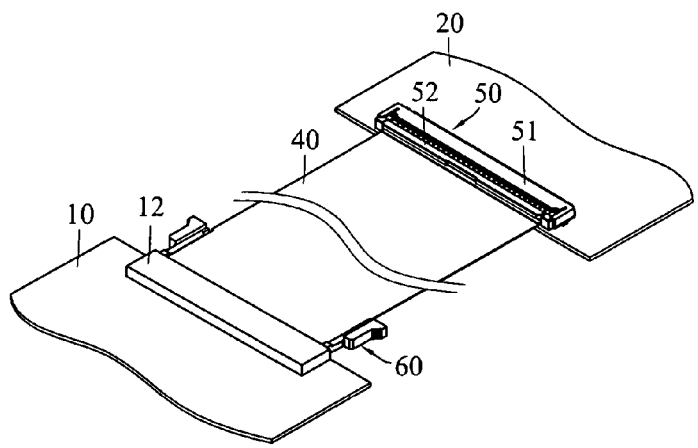

FIG. 13 is an illustrative view of the LVDS signal transmission system 11, wherein the first electric conductive section 44 of the flexible flat cable 40 is inserted as depicted in FIG. 2 and the movable lid 52 of the lift-up connector 50 is closed, the first electric conductive section 44 of the flexible flat cable 40 is fixed into the lift-up connector 50.

DETAILED DESCRIPTION OF THE PREFERRED EMBODIMENTS

Figure 4:
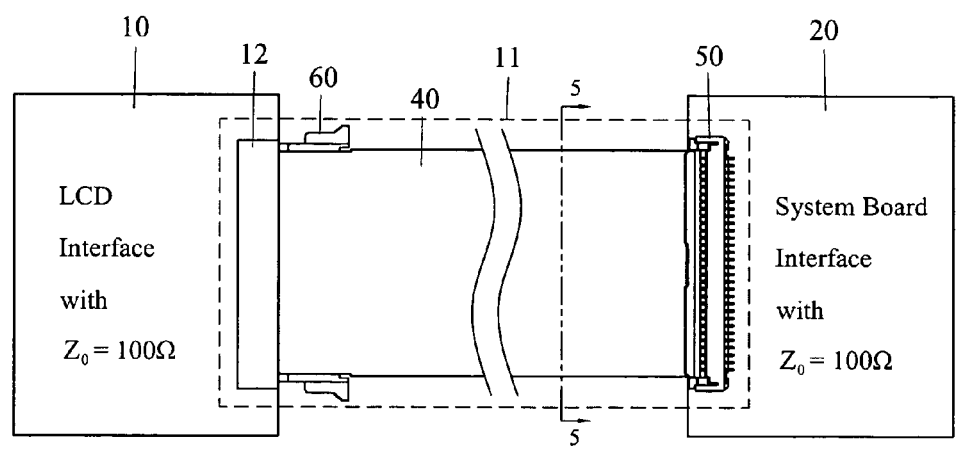
Figure 6:
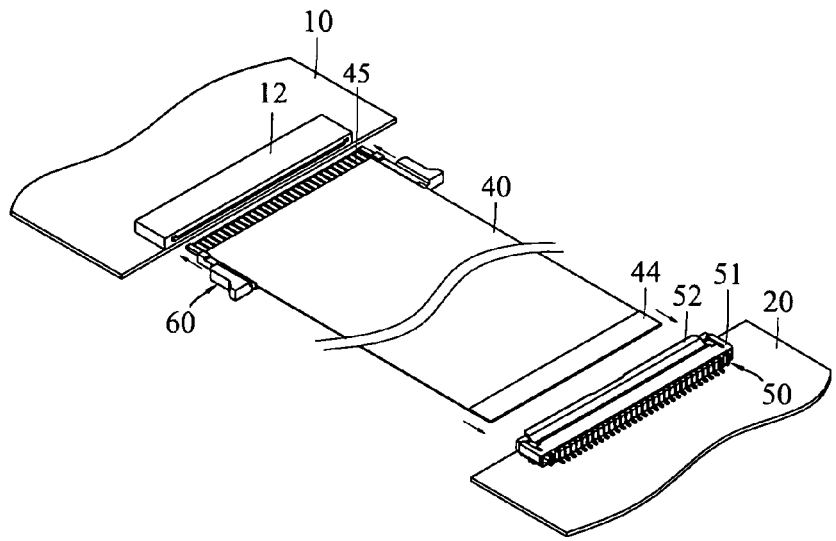
FIG. 6 is an exploded view of the LVDS signal transmission system 11 according to the present invention.

As shown in FIGS. 4 and 6, an LVDS signal transmission system 11 is disclosed to the present invention, and the LVDS signal transmission system 11 is a high-frequency signal transmission system used between a LCD interface 10 and a system board interface 20.

The LVDS signal transmission system 11 of the present invention has four components comprising an LVDS receiver 12, a flexible flat cable 40 having a characteristic impedance ($Z_0$) of 100Ω+5%, a lift-up connector 50 and an accessory insert board 60.

The LVDS receiver 12 complies with the LVDS standard and specifications and is disposed on a liquid crystal display interface 10 to constitute a signal transmission interface of the LCD interface 10 while electrically connecting the second electric conduction section 45 of the flexible flat cable 40 having characteristic impedance ($Z_0$) of 100Ω±5%.

Figure 5:
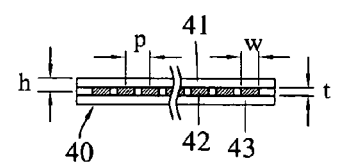
FIG. 5 is a cross-sectional view of Section 5—5 as depicted in FIG. 4 showing the cross-sectional structure of the flexible flat cable 40 according to the present invention.

The flexible flat cable 40 of the present invention has the same structure as the prior flexible flat cable, which is a stacked three-layer structure as shown in FIG. 5 comprising an upper PET insulator layer 41, a conductive wire layer 42 and a lower PET insulator layer 43; wherein the conductive wire layer 42 comprises a plurality of parallel conductors disposed at equidistant intervals p, and the upper PET insulator layer 41 and the lower PET insulator layer 43 are made of a material produced by coating a special saturated polyester resin through the PET film, and wrapping the conductive wire layer 42 in the middle by a hot pressing process of a machine to integrate the two as a whole and thus provides an appearance as shown in FIG. 6 for the flexible flat cable 40.

A first electric conductive section 44 is disposed at an end of the flexible flat cable 40 for electrically connecting a lift-up connector 50 and serving as a signal transmission interface of the system board interface 20, and a second electric conductive section 45 is disposed at the other end of the flexible flat cable 40 for electrically connecting a LVDS receiver 12 and serving as a signal transmission interface of the LCD interface 10.

Since the manufacturing process of this kind of flexible flat cable 40 is simple, therefore it has the advantage of a low manufacturing cost and the features of soft, refractory and temperature resisting features.

Further, the characteristic impedance ($Z_0$) of this kind of flexible flat cable 40 is inversely proportional to the width w and the thickness t of the conductor of the conductive wire layer 42 of the flexible flat cable 40.

If the width w or the thickness t of the conductor of the conductive wire layer 42 of the flexible flat cable 40 is increased, then the characteristic impedance ($Z_0$) will drop accordingly; and if the width w or the thickness t of the conductor of the conductive wire layer 42 of the flexible flat cable 40 is decreased, then the characteristic impedance ($Z_0$) will rise accordingly.

In addition, the characteristic impedance ($Z_0$) of this kind of the flexible flat cable 40 also relates to the thickness and the dielectric constant of the insulator layers of the upper PET insulator layer 41 and the lower PET insulator layer 43 of the flexible flat cable 40.

More particularly, the characteristic impedance ($Z_0$) of the flexible flat cable 40 is inversely proportional to the thickness t of the insulator layers of the upper PET insulator layer 41 and the lower PET insulator layer 43 of the flexible flat cable 40.

If the thickness t of the insulator layer of the upper PET insulator layer 41 and the lower PET insulator layer 43 of the flexible flat cable 40 is increased, the characteristic impedance ($Z_0$) of the flexible flat cable 40 will drop accordingly; and if the thickness t of the insulator layer of the upper PET insulator layer 41 and the lower PET insulator layer 43 of the flexible flat cable 40 is decreased, the characteristic impedance ($Z_0$) of the flexible flat cable 40 will rise accordingly.

Therefore, a flexible flat cable 40 having a characteristic impedance ($Z_0$) of $100\Omega \pm 5\%$ may be produced to fit the LVDS signal transmission system 11 according to the present invention by adjusting the width w of the conductor of the conductive wire layer 42 of the flexible flat cable 40 or the thickness t of the insulator of the upper PET insulator layer 41 or the lower PET insulator layer 43.

As shown in FIGS. 11 to 13, since the LVDS signal transmission system 11 of the present invention uses the flexible flat cable 40 as a transmission line and the characteristic impedance ($Z_0$) is specially adjusted to $100\Omega \pm 5\%$, and the rest of the structure is the same as that of the prior flexible flat cable (FFC), therefore a prior flexible flat cable (FFC) may be used for electrically connecting the connector of the present invention, and disposed on the system board interface 20 to constitute a signal transmission interface with the system board interface 20.

Basically, this kind of connector built on the system board interface 20 is a lift-up connector 50 having a main body 51 and a movable lid 52 as shown in FIGS. 11 to 13. If the movable lid 52 is pulled out and lifted up, the space of the slot of the main body 51 for receiving terminal pins is exposed as to accommodate the insertion of a first electric conductive section 44 of the flexible flat cable 40 according to the present invention. Then, the movable lid 52 is shut downward and pushed inside to a fixed position, so that the first electric conductive section 44 of the flexible flat cable 40 will be fixed into the slot of the main body 51 and electrically connected with the terminal of the lift-up connector 50. If the steps of the operating procedure are reversed, the flexible flat cable 40 shall be taken out easily and separated from the first electric conductive section 44 of the flexible flat cable 40 and the lift-up connector 40.

Since the first electric conductive section 44 of the flexible flat cable 40 of the present invention does not require a plug or a socket of the connect, but it shall directly connect with the lift-up connector 50 for the electric connection with the lift-up connector 50, and thus the present invention shall achieve the objectives of reducing the quantity of components of the LVDS signal transmission system 11.

More particularly, the present invention adopts a low-cost flexible flat cable 40 as the transmission line 11 for the LVDS signal transmission system 11, and thus may achieve the objective of lowering costs.

As shown in FIGS. 6 to 8, for the LVDS signal transmission system 11 of the present invention is in order to electrically connect the second electric conductive section 45 of the flexible flat cable 40 with the LVDS receiver 12 of the LCD interface 10, and to prevent an electric disconnection between the second electric conductive section 45 of the flexible flat cable 40 and the LVDS receiver 12, an accessory insert board 60 is therefore stuck on the bottom of the second electric conductive section 45 of the flexible flat cable 40 to accomplish the foregoing objectives.

The accessory insert board 60 has an indented space 61 for accommodating the flexible flat cable 40 including a small area of the second electric conductive section 45, so that the accessory insert board 60 shall be adhered onto the bottom of the flexible flat cable 40 by means of the adhesion measure to produce the flexible flat cable 40 including an end section of the second electric conductive section 45. In the meantime, the second electric conductive section 45 of the flexible flat cable 40 and the front section 62 of the accessory insert board 60 define a body and a structure similar to the LVDS connector.

Therefore, after the second electric conductive section 45 of the flexible flat cable 40 and the front section 62 of the accessory insert board 60 are inserted into the slot of the LVDS receiver 12 as shown in FIGS. 6 and 11, the second electric conductive section 45 of the flexible flat cable 40 and the terminal of the LVDS connector 12 are electrically connected and will not be separated from each other when used. If it is necessary to remove the flexible flat cable 40, the steps of the foregoing procedure is reversed to remove the flexible flat cable 40 easily and separate the second electric conductive section 45 of the flexible cable 40 from the LVDS receiver 12.

As shown in FIGS. 4, 6, 11, 12 and 13, the LVDS signal transmission system 11 of the present invention is a high-frequency signal transmission system used between the LCD interface 10 and the system board interface 20, and also is a four-component LVDS signal transmission system 11.

The LVDS receiver 12 is disposed on the LCD interface 10 and the lift-up connector 20 is disposed on the system board interface 20. Then, the first electric conductive section 44 of the flexible flat cable 40 having a characteristic impedance ($Z_0$) of 100Ω±5% is electrically connected with the lift-up connector 50, and the second electric conductive section 45 of the same flexible flat cable 40 and the front section 62 of the accessory insert board 60 are inserted into the LVDS receiver 12 to constitute the LVDS signal transmission system 11 of the present invention after the second electric conductive section 45 of this flexible flat cable is electrically connected with the LVDS receiver 12.

As shown in FIGS. 9 and 10, the LVDS signal transmission system 11 of the present invention 11 is further designed to have EMI resisting function. An EMI resisting metal coupler 70 disposed on the accessory insert board 60 for accommodating the flexible flat cable 40 may be adhered to the flexible flat cable 40 at the end coupled with the accessory insert board 60.

This EMI metal coupler 70 has an upper plate 71 and a lower plate 72, such that the coupling mechanism of the upper plate 71 and the lower plate 72 can be integrated as a whole. In the meantime, this EMI resisting metal coupler 70 is coupled and fixed onto the accessory insert board 60 that contains a flexible flat cable 40, so that the flexible flat cable 40 has the EMI resisting function at the end connected to the LVDS receiver 12.

Therefore, another preferred embodiment of the present invention provides a five-component LVDS signal transmission system 11 which comprises a LVDS receiver 12, a flexible flat cable 40 having a characteristic impedance ($Z_0$) of 100Ω±5%, an accessory insert board 60, an EMI metal coupler 70 and a lift-up connector 50 to add the EMI resisting effect to the LVDS signal transmission system 11 of the present invention.

The following embodiments of Example 1~11 are used to describe the conditions for accomplishing the flexible flat cable 40 having characteristic impedance ($Z_0$) of 100Ω±5%.

In FIG. 5, the width w or the thickness t of the conductor of the conductive wire layer 42 of the flexible flat cable 40 of the present invention are adjusted, or the thickness h of the insulator layer of the upper PET insulator layer 41 or the lower PET insulator layer 43 of the flexible flat cable 40 is adjusted but the distance p between the conductors of the conductive wire layer 42 is maintained constant to produce eleven different flexible cable wires 40.

The time domain reflectometry (TDR) is used to measure the characteristic impedance ($Z_0$) (also known as differential impedance) of each flexible flat cable 40; wherein the width w and thickness t of the conductor and the thickness h of the insulator layer are set.

The measured results of the characteristic impedance ($Z_0$) for different conditions are listed in Table 1.

TABLE 1

| Example | Pitch | Insulator Layer Dielectric Constant (Er) | Insulator Layer Thickness (h) unit: μm | Conductor Thickness (t) unit: mm | Conductor Width (w) unit: mm | Differential Impedance ($Z_0$) unit: Ω |
|---|---|---|---|---|---|---|
| 1 | 1.0 | 3.2 | 37 | 0.035 | 0.70 | 128~137 |
| 2 | 1.0 | 3.2 | 37 | 0.05 | 0.65 | 131~142 |
| 3 | 1.0 | 3.2 | 37 | 0.1 | 0.65 | 127~135 |
| 4 | 1.0 | 3.2 | 47 | 0.035 | 0.70 | 120~135 |
| 5 | 1.0 | 3.2 | 65 | 0.035 | 0.70 | 120~132 |
| 6 | 1.0 | 3.2 | 92 | 0.035 | 0.70 | 116~126 |
| 7 | 1.0 | 3.2 | 92 | 0.05 | 0.80 | 94~97 |
| 8 | 1.0 | 3.2 | 65 | 0.05 | 0.80 | 99~104 |
| 9 | 1.0 | 3.2 | 65 | 0.05 | 0.77 | 105~110 |
| 10 | 1.0 | 3.2 | 65 | 0.05 | 0.83 | 95~100 |
| 11 | 1.0 | 3.2 | 50 | 0.05 | 0.80 | 97~102 |

According to the results given in Table 1, it shows that the measured characteristic impedance ($Z_0$) of the flexible flat cable 40 corresponding to the Example 1 to 7 or Example 9 does not fall within the range of 100Ω±5%, and thus those flexible flat cables 40 are not suitable to be used in the LVDS signal transmission system 11 according to the present invention.

The measured characteristic impedance ($Z_0$) of the flexible flat cable 40 corresponding to the Example 8, 10 or 11 falls in the range of 100Ω±15% m and thus those flexible flat cables 40 are suitable to be used in the LVDS signal transmission system 11 according to the present invention.

Further according to the results given in Table 1, if the width w and thickness t of the conductor and the thickness h and the dielectric constant Er of the insulator layer of the flexible flat cable 40 satisfy the following two groups of conditions, a flexible flat cable having the characteristic impedance ($Z_0$) of 100Ω±5% together with a LVDS connector 12, an accessory insert board 60 and a lift-up connector 50 constitute a four-component LVDS signal transmission system 11, which may achieve the objectives of reducing the quantity of components and lowering the costs for the LVDS signal transmission system.)

(1) Er=3.2; h=65 μm;
  t=0.05 mm; and w=0.8~0.83 mm or
(2) Er=3.2; h=50~65 μm;
  t=0.05 mm; and w=0.8 mm.

In addition, the present invention also breaks through the traditional prejudice of being unable to use a flexible flat cable as a LVDS transmission line.

What is claimed is:

1. A low voltage differential signaling (LVDS) signal transmission system, being a high-frequency signal transmission system applied between a liquid crystal display interface and a system board interface, and comprising a low voltage differential signaling (LVDS) receiver, a flexible flat cable (FFC) having a characteristic impedance ($Z_0$) of 100±5%, an accessory insert board and a lift-up connector; wherein said LVDS receiver defining a signal transmission interface of said liquid crystal display interface; said flexible flat cable having a characteristic impedance ($Z_0$) of 100±5% being stacked with an upper PET insulator layer, a conductive wire layer and a lower PET insulator layer to define a three-layer stacked structure; wherein one end of said flexible flat cable constitutes a first electric conductive section for electrically coupling said lift-up connector and the other end constituting a second electric conductive section for electrically coupling said LVDS receiver; said accessory insert board having an indented space for accommodating said flexible flat cable and being fixed under a small area of said flexible flat cable including said second electric conductive section, thereby said second electric conductive section and the front end section of said accessory insert board defining a structure similar to a LVDS connector for inserting into said LVDS receiver and electrically connecting said LVDS receiver; and said lift-up connector defining a signal transmission interface for said system board interface and having a main body and a movable lid; as said movable lid is lifted up to allow said first electric conductive section of said first flexible flat cable to be inserted into a slot with installed terminals of said main body; as said movable lid is closed downward and fixed in a position to allow said first electric conductive section of said flexible flat cable to be fixed into said slot of said main body and electrically coupled with said slot.

2. The low voltage differential signaling (LVDS) signal transmission system of claim 1, wherein said flexible flat cable has a dielectric constant Er, a PET insulator layer thickness h, a conductor thickness t and a conductor width w to satisfy the conditions of Er=3.2; h=65 μm; t=0.05 mm; and w=0.8~0.83 mm.

3. The low voltage differential signaling (LVDS) signal transmission system of claim 2, wherein said accessory insert board is installed with said flexible flat cable comprising an electromagnetic interference resisting metal coupler for providing an electromagnetic interference resisting function to an end where said flexible flat cable and said low voltage differential signaling receivers are coupled.

4. The low voltage differential signaling (LVDS) signal transmission system of claim 3, wherein said electromagnetic interference resisting metal coupler comprises an upper plate and a lower plate and said upper and lower plates are integrally coupled.

5. The low voltage differential signaling (LVDS) signal transmission system of claim 1, wherein said insulator layer has a dielectric constant (Er), a PET insulator thickness (h), a conductor thickness (t) and a conductor width (w) of said flexible flat cable that satisfies the conditions of Er=3.2; h=50~65 μm; t=0.05 mm; and w=0.8 mm.

6. The low voltage differential signaling (LVDS) signal transmission system of claim 5, wherein said accessory insert board is installed with said flexible flat cable comprising an electromagnetic interference resisting metal coupler for providing an electromagnetic interference resisting function to an end where said flexible flat cable and said low voltage differential signaling receivers are coupled.

7. The low voltage differential signaling (LVDS) signal transmission system of claim 6, wherein said electromagnetic interference resisting metal coupler comprises an upper plate and a lower plate and said upper and lower plates are integrally coupled.

8. The low voltage differential signaling (LVDS) signal transmission system of claim 1, wherein said accessory insert board is installed with said flexible flat cable comprising an electromagnetic interference resisting metal coupler for providing an electromagnetic interference resisting function to an end where said flexible flat cable and said low voltage differential signaling receivers are coupled.

9. The low voltage differential signaling (LVDS) signal transmission system of claim 8, wherein said electromagnetic interference resisting metal coupler comprises an upper plate and a lower plate and said upper and lower plates are integrally coupled.

* * * * *